United States Patent
Yasukawa

(10) Patent No.: US 6,831,623 B2
(45) Date of Patent: *Dec. 14, 2004

(54) LIQUID CRYSTAL PANEL SUBSTRATE, LIQUID CRYSTAL PANEL, AND ELECTRONIC EQUIPMENT AND PROJECTION TYPE DISPLAY DEVICE BOTH USING THE SAME

(75) Inventor: Masahiro Yasukawa, Chino (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/091,544

(22) PCT Filed: Oct. 21, 1997

(86) PCT No.: PCT/JP97/03802

§ 371 (c)(1),
(2), (4) Date: Jul. 1, 1998

(87) PCT Pub. No.: WO98/18044

PCT Pub. Date: Apr. 30, 1998

(65) Prior Publication Data

US 2001/0043175 A1 Nov. 22, 2001

(30) Foreign Application Priority Data

Oct. 22, 1996 (JP) ............................................. 8-279389

(51) Int. Cl.[7] ........................... G09G 3/36; G02F 1/136; G02F 1/1335; G02F 1/1333
(52) U.S. Cl. ............................ 345/90; 345/98; 345/102; 349/44; 349/137; 349/138
(58) Field of Search .............................. 345/87, 90, 92, 345/100, 102, 98; 349/44, 113, 137, 138

(56) References Cited

U.S. PATENT DOCUMENTS 4,759,610 A * 7/1988 Yanagisawa ................ 349/162
5,130,829 A * 7/1992 Shannon ..................... 349/111
5,155,612 A * 10/1992 Adachi et al. .............. 349/111
5,327,001 A * 7/1994 Wakai et al. ................ 257/350
5,365,355 A * 11/1994 Hastings, III et al. ........ 349/42
5,414,547 A * 5/1995 Matsuo et al. ................ 349/44
5,426,526 A * 6/1995 Yamamoto et al. ........... 349/42
5,500,750 A * 3/1996 Kanbe et al. ................. 349/42
5,706,067 A     1/1998 Colgan et al. .............. 349/114
5,917,563 A * 6/1999 Matsushima ................. 349/38
5,933,204 A * 8/1999 Fukumoto .................... 349/43
5,978,056 A * 11/1999 Shintani et al. ............. 349/137
6,087,648 A * 7/2000 Zhang et al. .............. 250/208.1
6,175,397 B1 * 1/2001 Inoue et al. .................. 349/86
6,232,939 B1 * 5/2001 Saito et al. .................... 345/93
6,239,777 B1 * 5/2001 Sugahara et al. ............. 345/85

FOREIGN PATENT DOCUMENTS

| JP | A-57-20778 | 2/1982 | ............ G09F/9/35 |
| JP | U-58-54679 | 4/1983 | ............ G09F/9/35 |
| JP | A-62-26858 | 2/1987 | ........... H01L/29/78 |
| JP | A-4-56827 | 2/1992 | ........... G02F/1/136 |
| JP | A-8-166601 | 6/1996 | ........... G02F/1/136 |
| JP | A-9-171195 | 6/1997 | ........... G02F/1/136 |

* cited by examiner

Primary Examiner—Bipin Shalwala
Assistant Examiner—Jeff Piziali
(74) Attorney, Agent, or Firm—Oliff & Berridge, PLC

(57) ABSTRACT

The present invention is a liquid crystal panel substrate that comprises: pixel units each having a pixel electrode, to be used as a reflective electrode and arranged in a matrix pattern on a substrate, and a switching element controlling a voltage applied to the pixel electrode; wherein between the pixel electrode and a conductive layer forming a terminal electrode of the switching element, a contact hole is provided for connecting the pixel electrode and the terminal electrode. A light-shielding layer, having an opening surrounding the portion in which the contact hole is formed, and having no opening in regions between a plurality of adjacent pixel electrodes, is formed between the pixel electrode and the conductive layer. Harmful effects due to light leaking through a space between the pixel electrodes can thereby be prevented.

28 Claims, 9 Drawing Sheets

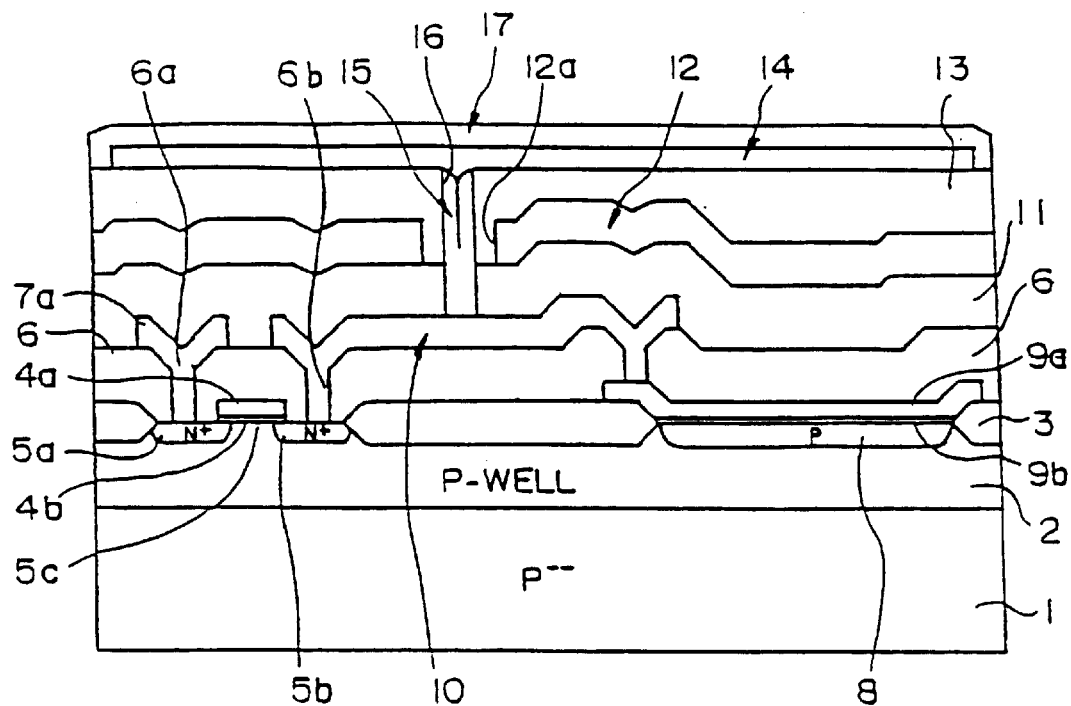
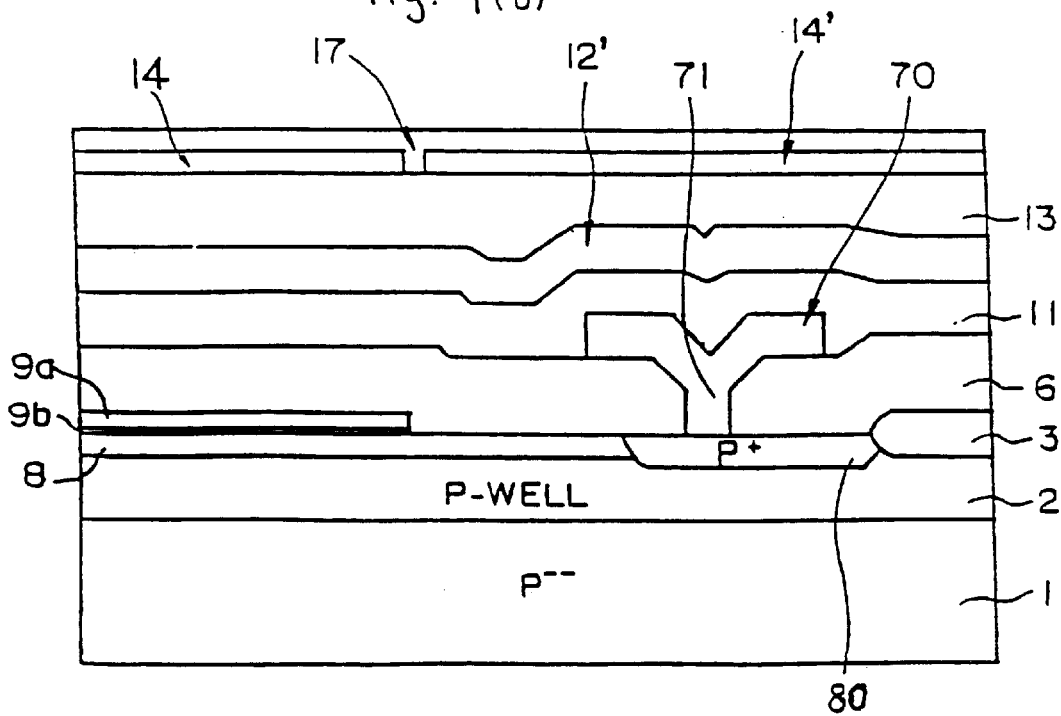

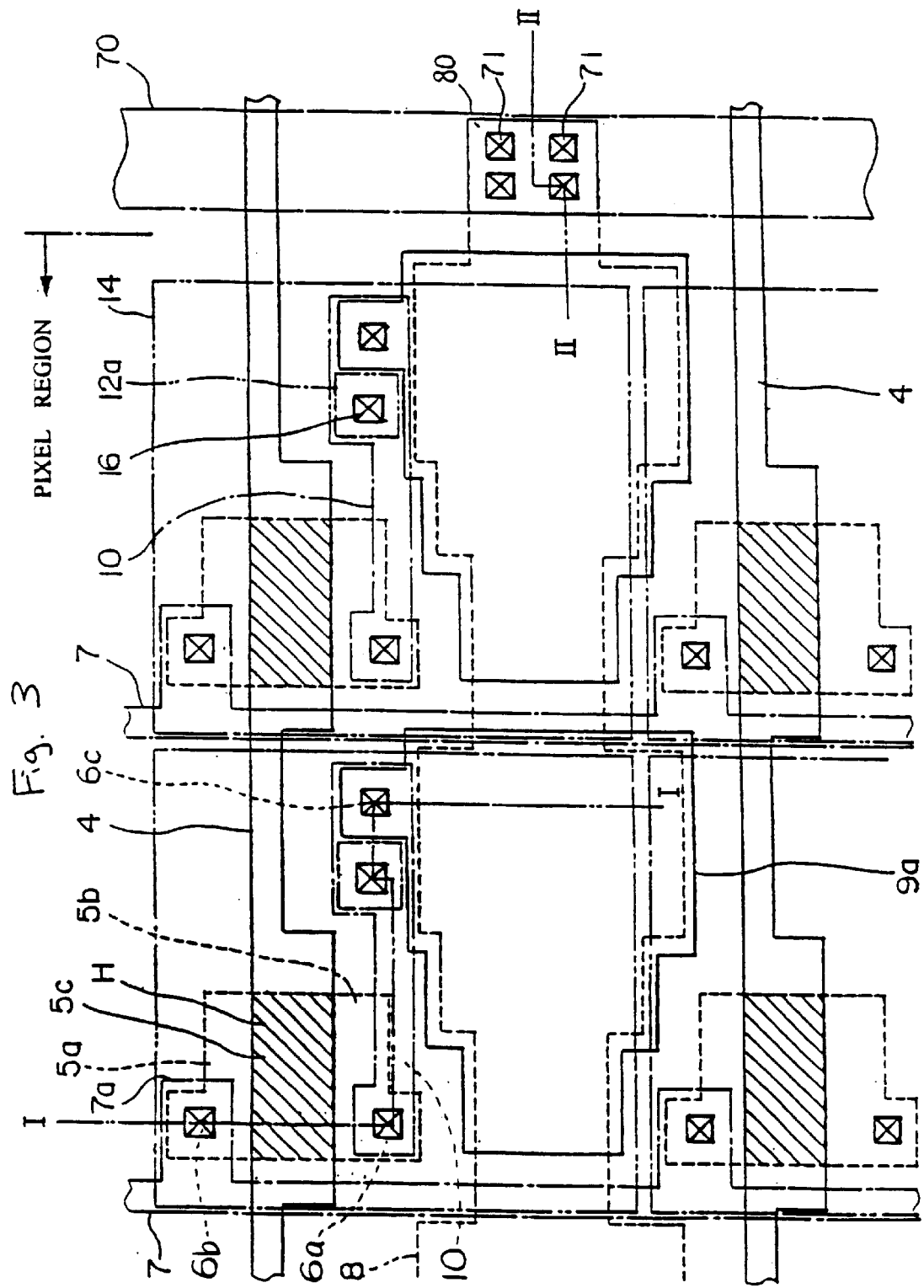

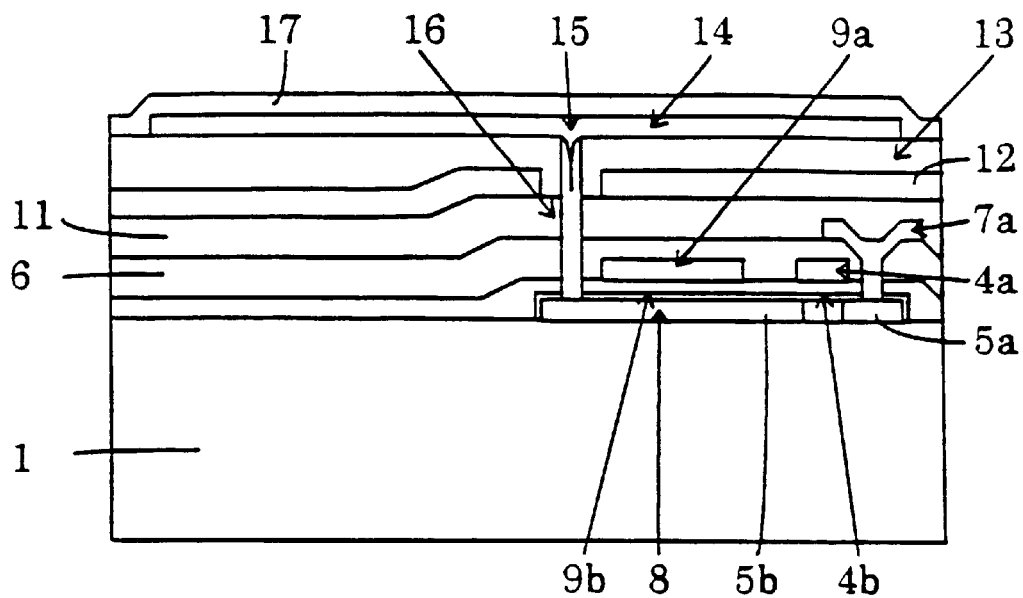

LIQUID CRYSTAL PANEL SUBSTRATE, LIQUID CRYSTAL PANEL, AND ELECTRONIC EQUIPMENT AND PROJECTION TYPE DISPLAY DEVICE BOTH USING THE SAME

BACKGROUND OF THE INVENTION

1. Field of the Invention

The present invention relates to liquid crystal substrates and reflective-type liquid crystal panels using the substrate, and in particular, relates to a technique that can preferably be applied to active-matrix liquid crystal panels in which pixel electrodes are switched by switching elements formed on the substrate. Furthermore, the present invention relates to electronic equipment and projection type display devices both using the liquid crystal panel.

2. Background of the Related Art

Conventionally, as active-matrix liquid crystal panels used for light valves of projection type display devices, liquid crystal panels having a thin film transistor (TFT) array, employing amorphous silicon, on a glass substrate as switching elements of pixels have been put into practical use.

Active-matrix liquid crystal panels using the above TFTs have low TFT element mobility and a large device size. Thus, for example, a projection type display device, such as a projector, equipped with the liquid crystal panel as a light valve, is disadvantageously large in size. Furthermore, transmissive-type liquid crystal panels have the following fatal disadvantage: the aperture ratio decreases as the resolution of the panel increases, such as XGA or SXGA, since the regions of the TFTs provided for every pixel do not transmit light.

As compared with the transmissive-type active-matrix liquid crystal panels, reflective-type active-matrix liquid crystal panels are small in size and have an insulated gate field effect transistor (MOSFET) array formed as switching elements on a semiconductor substrate so as to control the voltage applied to pixel electrodes which are to be used as reflective electrodes.

As is mentioned above, in active-matrix liquid crystal panels having transistor elements formed on a glass or semiconductor substrate, when light leaks through spaces formed between the pixel electrodes, hole-electron pairs are generated in a PN junction (e.g., a junction between source/drain regions and a channel region of the transistor, or a junction between source/drain regions and a well) of the semiconductor layer or semiconductor substrate, so that a light leakage current flows and undesirably destabilizes the electric potential of the semiconductor layer, the semiconductor substrate, or the well. In the case of reflective-type liquid crystal panels, the amount of light leakage can be reduced as compared with that of the transmissive type by, for example, forming the pixel electrodes close to each other in the top layer without using particular light-shielding means. However, in reflective-type liquid crystal panels used for light valves of projection type display devices, strong light is converged and is incident on the spaces between the pixel electrodes. Thus, it is not sufficient to arrange the pixel electrodes close to each other to avoid the light leakage current.

In particular, since liquid crystal panels with a semiconductor substrate have well regions, the leaking light transmitted through not only the transistor portion but also the portion at a certain distance from the transistor portion may cause a light leakage current. Therefore, unless sufficient countermeasures are taken, the light leakage current increases as compared with liquid crystal panels having TFTs as switching elements on a glass substrate.

Furthermore, in active-matrix liquid crystal panels having transistor elements on a glass or semiconductor substrate, peripheral circuits such as a scanning side driving circuit and a data line driving circuit are formed on the same substrate; there is a problem such that the light leakage current is generated and the peripheral circuits are operated by mistake when light enters to such peripheral circuits.

Moreover, in reflective-type liquid crystal panels, an insulating film is exposed by the spaces between the pixel electrodes, and the light reflected by the surface of the insulating film changes its direction by 180° and emerges. As a result, the emerging light is displayed as unwanted light, which deteriorates the quality of the image.

SUMMARY OF THE INVENTION

It is therefore an object of the invention to provide a technique by which the amount of light leaking through the spaces between pixel electrodes is reduced so that the light leakage current generated in a substrate decreases.

Another object of the present invention is to provide a technique for reducing the amount of light leaking into the pixel region and peripheral circuits without increasing the number of the process steps in reflective-type liquid crystal panels in which pixel electrodes are arranged in a matrix pattern and peripheral circuits are provided outside the pixel region.

Still another object of the present invention is to provide a technique for preventing adverse effects on image quality due to the light reflected by the surface of an insulating film exposed to the spaces between the pixel electrodes in reflective-type liquid crystal panels.

The first through eighteenth aspects of the invention are discussed below.

First, a liquid crystal panel substrate comprises: pixel units each having a pixel electrode to be used as a reflective electrode and arranged according to a matrix pattern on a substrate; and a switching element controlling a voltage applied to the pixel electrode;

in which between the pixel electrode and a conductive layer comprising a terminal electrode of the switching element, a contact hole is made for connecting the pixel electrode and the terminal electrode; and a light-shielding layer, having an opening surrounding the portion in which the contact hole is formed, and having no opening in regions between a plurality of adjacent pixel electrodes, is formed between the pixel electrode and the conductive layer. The amount of light leaking through the space between the pixel electrodes and reaching the switching element can thereby be reduced to substantially zero.

Secondly, an anti-reflection film is provided between the pixel electrode and the light-shielding layer. The light which is incident on the space between the pixel electrodes and reflected by the surface of the light-shielding layer can thereby be absorbed even when the light-shielding layer is formed of a metallic layer having a relatively high reflectance, such as aluminum.

Thirdly, the anti-reflection film has substantially the same shape as that of the pixel electrode and is provided below the pixel electrode. Thus, the following phenomenon can be prevented: the light, which is incident on the space between the pixel electrodes, is repeatedly reflected between the surface of the light-shielding layer and the back surface of the pixel electrodes, leaks through an opening provided at the portion of a connecting conductor connecting a pixel electrode and a switching electrode, reaches a semiconductor layer or a semiconductor substrate, and generates a light leakage current.

Fourthly, the anti-reflection film is made of titanium nitride. Titanium nitride has excellent adhesion to the pixel electrode such as Al and has excellent light absorbance.

Fifthly, the film thickness of the titanium nitride is 500 to 1000 angstroms. This range is preferable to absorb visible light.

Sixthly, in regions between a plurality of adjacent pixel electrodes, a groove at least having a slope is formed on the surface of an underlying insulating layer of the pixel electrode or on the surface of the light-shielding layer under the underlying insulating layer. The light entering through a space between the pixel electrodes can thereby be reflected in an oblique direction. Thus, the following phenomenon can be prevented: the light incident on the space is reflected by the light-shielding layer, emerges through the space, and is mixed with the light reflected by the pixel electrodes. As a result, the contrast of the liquid crystal panel can be improved.

Seventhly, the anti-reflection film has substantially the same shape as that of the pixel electrode and is provided below the pixel electrode. The light reflected by the surface of the insulating film, exposed by spaces between the pixel electrodes, or the light-shielding layer below the insulating film, is thereby absorbed into the antireflection film formed on the back surface of the pixel electrodes so that the light is prevented from emerging while changing its direction is changed by 180°, resulting in improved image quality.

Eighthly, the anti-reflection film is made of titanium nitride.

Ninethly, the film thickness of the titanium nitride is 500 to 1000 angstroms. The effects thereof are similar to those of the fourth and fifth effects.

Tenthly, the contact hole is provided at a substantially central position of the plane of the pixel electrode. The distance between the end portion of the pixel electrode and the opening provided in the light-shielding layer is therefore substantially the same for each end portion. Thus, the travel distance of the light, entering through a space between the adjacent electrodes and reaching the contact hole, is increased and the light cannot readily reach the switching element side.

Eleventhly, a liquid crystal panel substrate comprises pixel units which are arranged in a matrix pattern on a substrate, and each of which has a pixel electrode to be used as a reflective electrode and a switching element controlling a voltage applied to the pixel electrode;

wherein a pixel region comprising a plurality of the pixel units and a peripheral circuit provided at a peripheral region of the pixel region are formed on the same substrate; and a light-shielding layer comprising the same layer as the reflective electrode of the pixel region is formed above the peripheral circuit. The amount of light leakage in the pixel region and the peripheral circuit can thereby be reduced, without increasing the number of steps for producing the liquid crystal panel substrate.

Twelvethly, the light-shielding layer is positioned at a peripheral region surrounding the entire periphery of the pixel region including a region in which the peripheral circuit is not formed. The pixel electrodes are positioned around the pixel region and serve as "partitions".

Thirteenthly, in the pixel region, a second light-shielding layer is provided between the pixel electrode and the switching element, and the second light-shielding layer is also provided in a region between the first light-shielding layer, which is provided above the peripheral circuit, and the pixel electrodes that are outermost in the pixel region. In the pixel region, the entrance of light from the border between the pixel region and the peripheral circuit region can be prevented by providing the second light-shielding layer under the pixel electrode.

Fourteenthly, between the pixel electrode and a conductive layer comprising a terminal electrode of the switching element, a contact hole is made for connecting the pixel electrode and the terminal electrode;

a second light-shielding layer, having an opening surrounding the portion in which the contact hole is formed in the pixel region and having no opening in regions between a plurality of adjacent pixel electrodes, is formed between the pixel electrode and the conductive layer; and in the peripheral circuit, the second light-shielding layer is also provided below the first light-shielding layer and is used as a connecting line portion in the peripheral circuit. Thus, multi-layer wiring can be achieved in the peripheral circuit portion by utilizing the light-shielding layer in the pixel region, and the driving circuit and the like can be integrated.

Fifteenthly, the second light-shielding layer has a light-shielding portion that extends or is separated from the connecting line portion. The peripheral circuit can thereby be protected from light by double-layered light-shielding layers.

Sixteenthly, the present invention can provide a liquid crystal panel which suppresses a reduction in contrast due to the light leakage current, and which comprises: a liquid crystal panel substrate according to the above-mentioned present invention; a light-incident-side substrate positioned opposing the liquid crystal panel substrate with a space therebetween; and a liquid crystal filled in the space.

Seventeenthly, the present invention can provide electronic equipment which is equipped with the above liquid crystal panel as a display portion, and which have a reflective type display device having excellent contrast at low electric power consumption.

Eighteenthly, the present invention can provide a small-sized projection type display device which has excellent contrast, and which comprises: a light source; the above liquid crystal panel reflecting and modulating the light emerging from the light source; and a projection optical means for collecting and projecting the light modulated by the liquid crystal panel.

BRIEF DESCRIPTION OF THE DRAWINGS

FIG. 1(a) is a cross-sectional diagram showing an embodiment of a pixel region on a reflective-electrode-side substrate of a reflective-type liquid crystal panel to which the present invention is applied.

FIG. 1(b) is a cross-sectional diagram showing a border between a pixel region and a peripheral region in the reflective-electrode-side substrate of the reflective-type liquid crystal panel incorporated in the present invention.

FIG. 3 is a plan layout diagram showing the embodiment of a pixel region in the reflective-electrode-side substrate of the reflective-type liquid crystal panel incorporated in the present invention.

FIG. 10 is a cross-sectional diagram showing another embodiment of a reflective-electrode-side substrate incorporated in the present invention.

DETAILED DESCRIPTION OF PREFERRED EMBODIMENTS

Preferred embodiments of the present invention will be explained with reference to accompanying drawings.
Description of a Liquid Crystal Panel Substrate Using a Semiconductor Substrate FIGS. 1a, 1b show the first embodiment of a reflective-electrode-side substrate of a reflective-type liquid crystal panel incorporated in the present invention. Among pixels arranged in a matrix pattern, one pixel is shown by the cross-sectional diagram and the plan layout in FIGS. 1a, 1b, respectively. FIG. 1(a) is a cross-sectional diagram taken along the line I—I in FIG. 3. Similarly, FIG. 1(b) is a cross-sectional diagram taken along the line II—II in FIG. 3.

Figure 5:
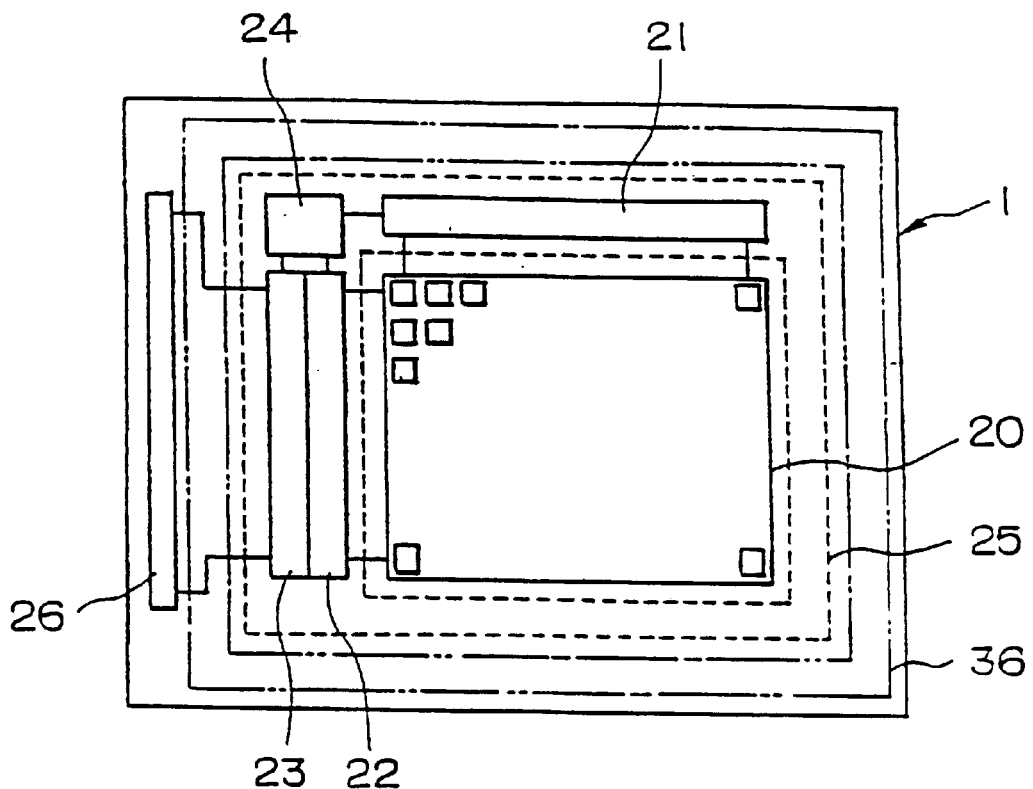
FIG. 5 is a plan diagram showing a structural example of a circuit layout of a reflective-electrode-side substrate of a reflective-type liquid crystal panel of the embodiment.

In FIGS. 1a and 1b, reference numeral 1 indicates a P-type semiconductor substrate (may be an N-type semiconductor substrate (N⁻)) such as single-crystal silicon, numeral 2 indicates a P-type well region formed on the surface of the semiconductor substrate 1, and reference numeral 3 indicates a field oxide film (so-called LOCOS) for separating elements, which is formed on the front surface of the semiconductor substrate 1. Although the well region 2 is not particularly limited, it is formed as a common well region of a pixel region formed by arranging pixels in a matrix pattern, such as 768×1024. Furthermore, the well region 2 may be formed separately from the well regions in which transistor elements comprising peripheral circuits are formed, such as a data-line driving circuit 21, a gate-line driving circuit 22, an input circuit 23, and a timing control circuit 24, as is shown in FIG. 5 illustrating a plan diagram of the whole liquid crystal panel substrate.

The carriers generated in a well region, in which the peripheral circuit elements operated by high-frequency clock are formed, flow into another well region of the pixel region, thereby causing the pixel transistors to malfunction. The malfunction can be prevented by separating the wells. In addition, the following effect of electrostatic noise from outside can also be prevented by separating the wells: noise enters the well region from the input circuit 23, reaches the portion of the well in the pixel region, and causes pixel transistors to malfunction.

The field oxide film 3, with a thickness of approximately 5000 to 7000 angstroms is formed by selective heat oxidation. In the field oxide film 3, each pixel has two openings such that a gate electrode 4a, made of poly-silicon, metallic silicide, etc. is formed in the center of one opening with a gate oxide film (insulating film) 4b interposed therebetween, and source and drain regions 5a and 5b both formed of a layer doped with a high concentration of N-type impurity (hereinafter referred to as doping layer) are formed at both sides of the gate electrode 4a on the surface of the substrate to form a field effect type transistor (MOSFET) as a switching element. The gate electrode 4a is extended in the scanning line direction (pixel row direction) to form a gate line 4.

A P-type doping region 8 is formed on the surface of the substrate in the other opening made in the field oxide film 3, and a gate electrode 9a, made of poly-silicon, metallic silicide, etc. is formed on the surface of the P-type doping region 8 with a gate oxide film (insulating film) 9b interposed therebetween so as to form an insulating film capacitor between the electrode 9a and the P-type doping region 8. The electrode 9a can be formed by the same process as that of the poly-silicon or metallic silicide layer to be used as the gate electrode 4a of the MOSFET, and the insulating film 9b below the electrode 9a can be formed by the same step as that of the insulating film to be used as the gate insulating film 4b.

The insulating films 4b and 9b, with thicknesses of approximately 400 to 800 angstroms, are formed on the surface of the semiconductor substrate inside the openings by heat oxidation. The electrodes 4a and 9a are formed such that an approximately 1000 to 3000 angstroms thick silicide layer is formed from a refractory metal, such as Mo or W, on an approximately 1000 to 2000 angstroms thick polysilicon layer. The source and drain regions 5a and 5b are formed in a self aligned manner as follows: by ion implantation, N-type impurities are doped into the surface of the substrate at both sides of the gate electrode 4a using the gate electrode 4a as a mask. A portion of the well region just below the gate electrode 4a is used as a channel region 5c of the MOSFET.

In addition, preferably, the P-type doping region 8 is formed by doping using exclusive ion implantation and heat treatment, and is formed by ion implantation before forming the gate electrode. In other words, after forming the insulating films 4b and 9b, impurities having the same polarity as that of the well are implanted such that the surface of the well has a higher impurity concentration than the well so as to achieve low resistance. The preferred impurity concentration of the well region 2 is not more than $1\times10^{17}/cm^3$, and more preferably, $1\times10^{16}$ to $5\times10^{16}/cm^3$. Although the preferred surface impurity concentration of the source and drain regions 5a and 5b is $1\times10^{20}$ to $3\times10^{20}/cm^3$ and the preferred surface impurity concentration of the P-type doping region 8 is $1\times10^{18}$ to $5\times10^{19}/cm^3$, $1\times10^{18}$ to $1\times10^{19}/cm^3$ is particularly preferable from the perspective of reliability and pressure durability of the insulating film forming a holding capacitor.

A first interlayer insulating film 6 is formed on the electrodes 4a and 9a and the field oxide film 3; data lines 7 (see FIG. 3), source electrodes 7a extended from the data lines, and auxiliary connecting lines 10 are formed of a metallic layer essentially consisting of aluminum and provided on the insulating film 6 such that each source electrode 7a is electrically connected to the source region 5a via a contact hole 6a made in the insulating film 6, one end of each auxiliary connecting line 10 is electrically connected to the drain region 5b via a contact hole 6b made in the insulating film 6, and the other end of each auxiliary connecting line 10 is electrically connected to the electrode 9a via a contact hole 6c made in the insulating film 6.

For example, the insulating film 6 is formed by depositing a thickness of approximately 8000 to 10000 angstroms of BPSG film (a silicate glass film containing boron and phosphorus) on HTO film (a silicon oxide film formed by high-temperature CVD) having a thickness of an approximately 1000 angstroms. For example, the metallic layer forming the source electrode 7a (data line 7) and the auxiliary connecting line 10 has a four-layer structure of Ti/TiN/Al/TiN from the bottom layer. The thickness of each layer is as follows: 100 to 600 angstroms for the lower Ti layer, approximately 1000 angstroms for the TiN layer, 4000 to 10000 angstroms for the Al layer, and 300 to 600 angstroms for the upper TiN layer.

A second interlayer insulating film 11 is formed over the source electrode 7a, the auxiliary connecting line 10, and the interlayer insulating film 6, and a light-shielding layer (light-shielding layer), formed of a second metallic layer 12 essentially comprising aluminum, is formed on the second interlayer insulating film 11. The second metallic layer 12 forming the light-shielding layer is also used as a metallic layer forming a connecting line between elements in the peripheral circuits such as a driving circuit formed around the pixel region, as is discussed below.

Therefore, it is unnecessary to add an extra step for forming the light-shielding layer 12, resulting in a simpler process. The light-shielding layer 12 covers the entire pixel region, except for an opening 12a, made at a position corresponding to the auxiliary connecting line 10, so as to pass a columnar connecting plug 15 electrically connecting the undermentioned pixel electrode to the MOSFET. In other words, in the plan view shown in FIG. 3, a rectangular frame indicated by the reference numeral 12a indicates the opening, and the outside of the opening 12a is the light-shielding layer 12. Light incident on the upper side of FIG. 1 (the liquid crystal layer side) can thereby be cut off almost completely. Thus, it is possible to prevent the light leakage current generated by the light incident on the channel of the MOSFET used for switching the pixel and well regions.

For example, the second interlayer insulating film 11 is formed as follows: using TEOS (tetraethylorthosilicate) as a material, a silicon oxide film (hereinafter referred to as TEOS film) of a thickness of approximately 3000 to 6000 angstroms is deposited by plasma CVD; an SOG film (spin on glass film) is deposited thereon and trimmed by etch back; and a second TEOS film of a thickness of approximately 2000 to 5000 angstroms is deposited thereon. The second metallic layer forming the light-shielding layer may be the same as that of the first metallic layer 7 (7a), and for example, it can have the four-layer structure of Ti/TiN/Al/TiN from the bottom layer. The thickness of each layer is as follows: 100 to 600 angstroms for the bottom Ti layer, approximately 1000 angstroms for the TiN layer, 4000 to 10000 angstroms for the Al layer, and 300 to 600 angstroms for the top TiN layer.

According to this embodiment, a third interlayer insulating film 13 is formed on the light-shielding layer 12, and on the third interlayer insulating film 13, a pixel electrode 14 is formed as a rectangular reflective electrode substantially corresponding to one pixel, as is shown in FIG. 3. A contact hole 16 penetrating the third interlayer insulating film 13 and the second interlayer insulating film 12 is formed inside the opening 12a made in the light-shielding layer 12, and the columnar connecting plug 15, which is made of a refractory metal such as tungsten, and which electrically connects the auxiliary connecting line 10 to the pixel electrode 14, is placed in the contact hole 16. In addition, a passivation film 17 is formed on the entire pixel electrode 14.

For assembling a liquid crystal panel, an alignment film is further formed on the reflective-electrode-side substrate, and then, an opposing substrate is positioned facing the substrate with a predetermined space therebetween. An opposing electrode (common electrode) is formed on the inner side of the opposing substrate beforehand, and the alignment film is formed thereon. The periphery of the pair of substrates is fixed by a sealing member, and then, a liquid crystal is poured and encapsulated into the thus-formed space to form a liquid crystal panel.

Although it is not particularly limited, after depositing tungsten, etc. comprising the connecting plug 15 by CVD, the tungsten and the third interlayer insulating film 13 are planarized by a CMP (chemical machine polish) method, the pixel electrode 14 is prepared, for example, by forming an aluminum layer of a thickness of approximately 300 to 5000 angstroms according to a low-temperature sputtering method, and formed into a square-like shape whose sides are approximately 15 to 20 $\mu$m by patterning. The connecting plug 15 may be formed by making a contact hole after planarizing the third interlayer insulating film 13 by the CMP method, and then, depositing tungsten inside the contact hole. As the passivation film 17, a silicon oxide film of a thickness of approximately 500 to 2000 angstroms is used for the pixel region, and a nitrogen oxide film of a thickness of approximately 2000 to 10000 angstroms is used for the peripheral circuit portion, sealing portion 36, and a scribe portion of the substrate. The sealing portion is formed by a sealing member for fixing a pair of substrates to assemble a liquid crystal panel, as is mentioned above. The scribe portion is a portion along the scribe region (i.e., the end portion of the liquid crystal panel substrate) for separating numerous reflective-side liquid crystal panel substrates of the present invention, formed in a semiconductor wafer, into semiconductor chips along scribe lines by dicing.

In addition, by using a silicon oxide film as the passivation film 17 covering the pixel region, it is possible to prevent the reflectance from changing a great amount due to a variation in the film thickness or in response to a wavelength of the light.

Meanwhile, a silicon nitride film, which is superior to the silicon oxide films as a protective film in the light of water resistance of the substrate, etc. is employed as the passivation film 17 covering the peripheral region of the substrate, particularly, outside the region in which the liquid crystal is encapsuled (outside the sealing member). The reliability can further be increased by employing a mono-layer structure having a silicon nitride film or a double-layer structure having a silicon nitride film formed on a silicon oxide film. In other words, moisture, etc. readily enters the peripheral region of the substrate exposed to the atmosphere, particularly in the scribe portion. Thus, the reliability and durability can be improved by covering such a portion with a protective film of silicon nitride.

Wavelength dependency of the reflectance of the pixel electrode can be reduced in a reflective-side liquid crystal panel by setting the thickness of the passivation film formed on the reflective electrode to within a range of from 500 to 2000 angstroms. At the time of assembling the liquid crystal panel, an alignment film made of a polyimide is formed on the entire surface of the passivation film 17 and subjected to rubbing.

FIG. 3 is a plan layout diagram illustrating the reflective-side liquid crystal panel substrate shown in FIG. 1. As is shown in the figure, the data line 7 and the gate line 4 are formed to cross each other in this embodiment. Since the gate line 4 also serves as the gate electrode 4a, the portion of the gate line 4 indicated by hatching H in FIG. 3 is used as the gate electrode 4a, and a channel region 5c of the pixel switching MOSFET is formed on the surface of the substrate below the gate electrode 4a. Source and drain regions 5a and 5b are formed on the surface of the substrate at both sides of the channel region 5c (shown as the upper and lower sides in FIG. 3). The source electrode 7a connected to the data line is formed such that it extends from the data line 7 provided along the vertical direction of FIG. 3 and is connected to the source region 5a of the MOSFET via a contact hole.

In addition, the P-type doping region 8 forming one terminal of the holding capacitor is formed in parallel to the gate line 4 (pixel row direction) and connected to a P-type doping region of the adjacent pixel. The P-type doping region 8 is connected to a power source line 70 via a contact hole 71, and a predetermined voltage $V_{ss}$, such as 0 V (ground voltage), is applied to the P-type doping region 8. The predetermined voltage $V_{ss}$ may be the same as, or approximately equal to, the voltage of the common electrode provided on the opposing substrate, the same, or approximately equal to, the center voltage of the amplitude of image signals supplied to the data line, or the intermediate voltage between the common electrode voltage and the center voltage of the amplitude of image signal voltage.

By commonly connecting each P-type doping region 8 to the voltage $V_{ss}$ in the outside of the pixel region, the voltage of one electrode of the holding capacitor is stabilized and the holding voltage held by the holding capacitor during the non-selected period of the pixel (non-conducting period of the MOSFET) is stabilized. Thus, variation in voltage applied to each pixel electrode during one frame period can be reduced. In addition, undesired voltage variation of the pixel electrode can be prevented. Furthermore, since the P-type doping region 8 is positioned near the MOSFET and the voltage of the P well is simultaneously fixed, the fundamental voltage of the MOSFET is stabilized. Thus, the variation in the threshold voltage due to the back gate effect can be prevented.

Although not shown in the figures, the power source line 70 is also used for supplying the predetermined voltage $V_{ss}$, as the well voltage, to the P-type well region of the peripheral circuits provided outside the pixel region. The power source line 70 is formed of a first metallic layer which is the same as the data line 7. The pixel electrode 14 is formed in a rectangular shape, provided near an adjacent pixel electrode 14 at a distance of, for example, 1 μm, so as to reduce as much as possible the amount of light leaking through the spaces between the pixel electrodes.

In the figures, the center of the shape of the pixel electrode is shifted from that of the contact hole 16. However, it is preferred that these centers are substantially coincident with, or superimposed onto, each other to reduce the amount of light leakage, since the travel distance of the light, incident on the space between pixel electrodes, from the end portion of the pixel electrode to the contact hole, thereby becomes substantially the same for each end portion. This is because, since the second metallic layer 12 having light-shielding light is opened by the opening 12a in the periphery of the contact hole 16, if the opening 12a is provided near the end portion of the pixel electrode 14, light which is incident from the space between the pixel electrodes is irregularly reflected between the second metallic layer 12 and the back surface of the pixel electrode 14, reaches the opening 12a, and is incident to the lower substrate side from the opening, resulting in light leakage. Therefore, by substantially matching or superimposing the center of the pixel electrode with that of the contact hole 16, the travel distance of the light, incident on the space between the pixel electrodes, from the end portion of the pixel electrode to the contact hole, thereby becomes substantially the same for each end portion of the pixel electrode. Thus, preferably, the light cannot readily reach the contact hole, through which the light may enter the substrate side.

In the above embodiment, a case in which the pixel switching MOSFET is an N-channel type, and the semiconductor region 8 to be used as one electrode of the holding capacitor is a P-type doping layer is described. However, it is also possible to have an N-type as the well region 2, a P-channel type as the pixel switching MOSFET and an N-type doping layer as the semiconductor region to be used as one electrode of the holding capacitor. In such a case, similarly to the N-type well region, it is preferred that a predetermined voltage $V_{DD}$ is applied to the N-type doping layer to be used as one electrode of the holding capacitor. The predetermined constant voltage $V_{DD}$ is preferably the voltage of the higher side of the power source voltage, since it is applied to the N-type well region. In other words, when the image signal voltage applied to the source/drain of the pixel switching MOSFET is 5 V, the predetermined constant voltage $V_{DD}$ is preferably set to 5 V.

In addition, since a logic circuit and the like such as a shift register of the peripheral circuits are driven by a small voltage such as 5 V (some of the peripheral circuits such as a circuit supplying scanning signals to the gate lines are driven at 15 V), while a large voltage such as 15 V is applied to the gate electrode 4a of the pixel switching MOSFET, the following technology is considered: the gate insulating film of a FET forming a peripheral circuit driven at 5 V is formed to be thinner than the gate insulating film of a pixel switching FET (by forming the gate insulating film by a separate step or by etching the surface of the gate insulating film of the FET of a peripheral circuit) so as to increase the operation speed of the peripheral circuit (particularly the shift register of the data-line-side driving circuit, for which high-speed scanning is required) by improving the response characteristics of the FET of the peripheral circuit. By employing this technique, the thickness of the gate insulating film of the FET forming a peripheral circuit can be decreased to approximately one third to one fifth (e.g. 80 to 200 angstroms) of that of the gate insulating film of the pixel switching FET in light of the pressure durability of the gate insulating film.

Figure 7:
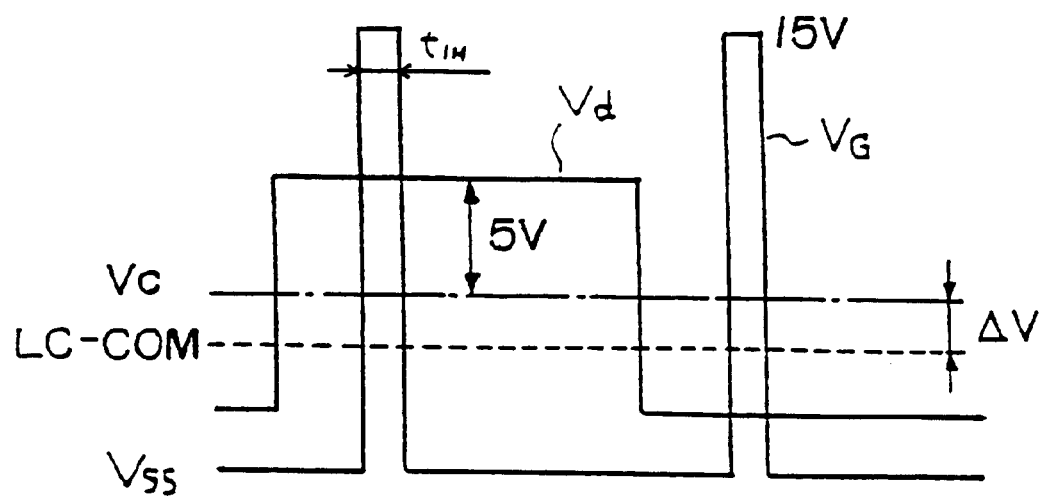
FIG. 7 shows wave-forms of the voltages applied to the gate line and the data line of a switching element of a pixel in a reflective-type liquid crystal panel incorporated in the present invention.

FIG. 7 shows the driving waveforms in the first embodiment. In the figure, $V_G$ indicates the scanning signal applied to the gate electrode of the pixel switching MOSFET, period $t_{1H}$ indicates the selected period (scanning period) during which the MOSFET of the pixel conducts, and the other period is the non-selected period during which the MOSFET of the pixel does not conduct. Furthermore, $V_d$ indicates the maximum amplitude of the image signals applied to the data line, $V_c$ indicates the center voltage of the image signals, and LC-COM indicates the common voltage applied to the opposing (common) electrode formed on the opposing substrate facing the reflective-electrode-side substrate.

Figure 6:
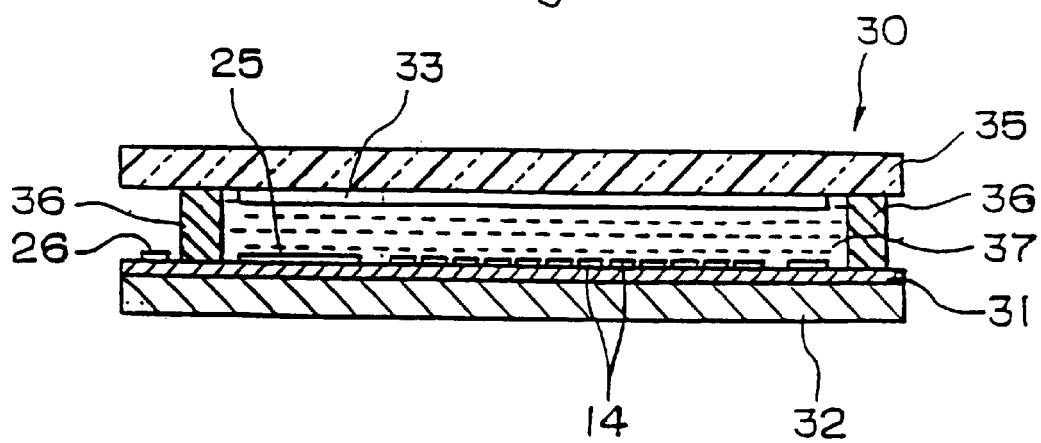
FIG. 6 is a cross-sectional diagram showing a structural example of a reflective-type liquid crystal panel to which the liquid crystal panel substrate of the embodiment is applied.
Figure 8:
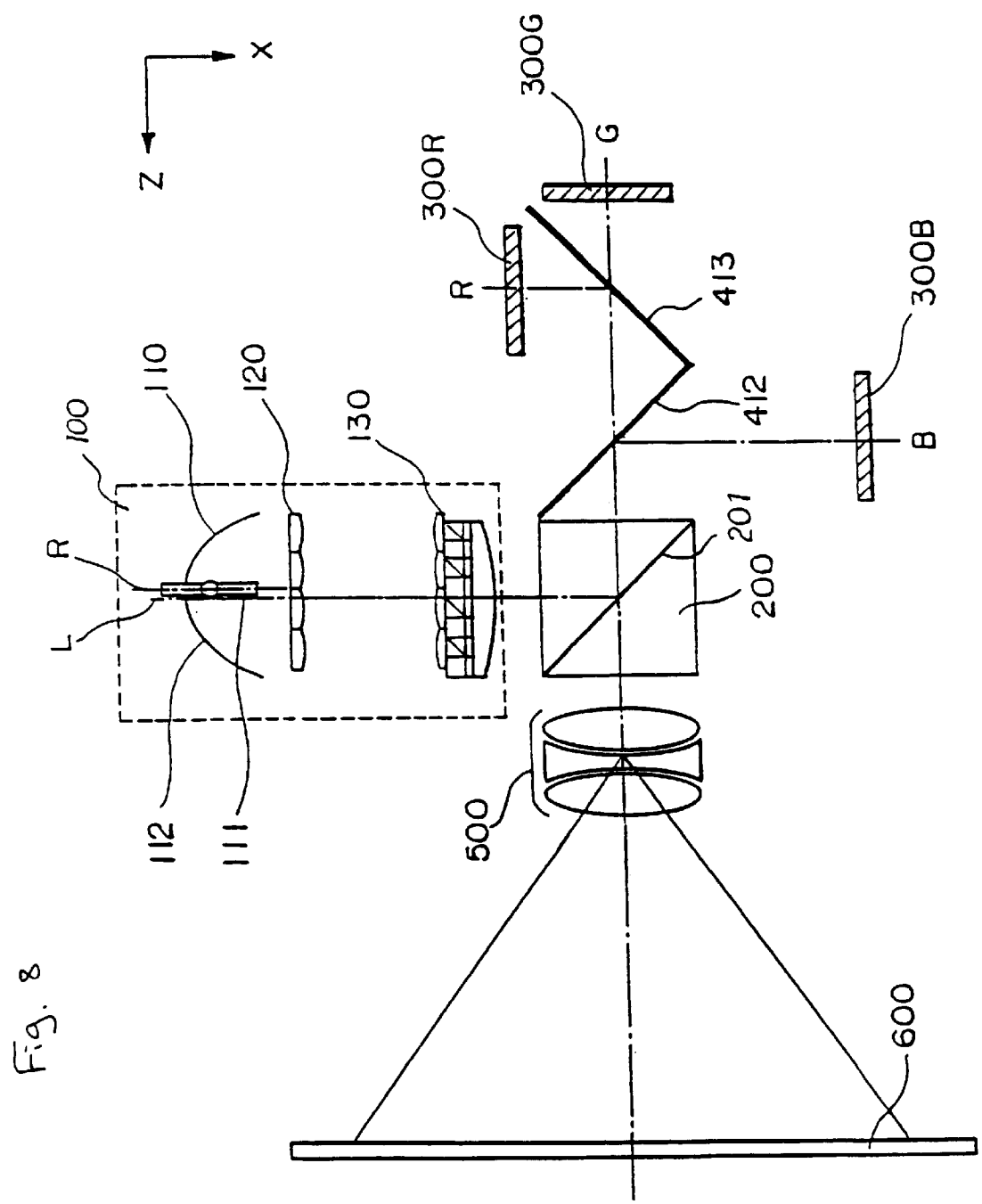
FIG. 8 is a diagram showing a projection type display device to which the reflective-type liquid crystal panel of the embodiment is applied as a light valve.

The voltage applied between the electrodes of the holding capacitor is determined by the difference between the image signal voltage $V_d$ applied to the data line shown in FIG. 8 and the predetermined voltage $V_{ss}$ such as 0V applied to the P-type semiconductor region 8. However, the necessary voltage difference fundamentally required to be applied to the holding capacitor is approximately 5V, which is the difference between the image signal voltage $V_d$ and the center voltage $V_c$ of the image signals (although the common voltage LC-COM applied to the opposing (common) electrode 33 provided on the opposing substrate 35 of the liquid crystal panel shown in FIG. 6 is shifted by $\Delta V$ from the $V_c$, the actual voltage applied to the pixel electrode is shifted by $\Delta V$ and becomes $V_d$-$\Delta V$). Thus, in the first embodiment, it is possible that the doping region 8 forming one terminal of the holding capacitor has a polarity opposite to that of the well (arranged to be N-type in the case of a P-type well), and is connected to the voltage of approximately $V_c$ or LC-COM in the periphery of the pixel region so as to have a different voltage from the well voltage (e.g., the P-type well is at $V_{ss}$). The insulating film 9b, just below the poly-silicon or metallic silicide layer forming one electrode 9a of the holding capacitor, can thereby be formed simultaneously with the gate insulating film of the FET forming the peripheral circuits, not with the gate insulating film of the pixel switching FET. Thus, the thickness of the insulting film of the holding capacitor can be reduced to one third to one fifth of that of the above embodiment, and as a result, the capacitance can be increased by three to five times.

FIG. 1(b) shows a cross-sectional view (FIG. 3 II—II) of a periphery of a pixel region of an embodiment of the present invention. This is a structure for connecting the doping region 8, extending along the scanning direction (pixel row direction) of the pixel region, to the predetermined voltage ($V_{ss}$). Reference numeral 80 indicates a P-type contact region formed by the same step as that of the source/drain regions of the MOSFET of the peripheral circuits, such that after forming the gate electrode, impurities having the same polarity are ion-implanted with respect to the doping region 8 prepared before forming the gate electrode. The contact region 80 is connected to the line 70 via a contact hole 71, and the constant voltage $V_{ss}$ is applied thereto. The contact region 80 is also light-shielded by a light-shielding layer 14', which is formed thereabove and which is formed of a third metallic layer. In other words, the light-shielding layer 14' is formed in the peripheral region surrounding the entire pixel region and the light-shielding layer 14' is separated from the pixel electrodes 14 of the pixels that are outermost in the pixel region. The light-shielding layer 14' is the same layer as the pixel electrodes 14. A first metallic layer 12' extends from the light-shielding layer 12 that is outermost in the pixel region so as to light-shield the light incident on the space between the outermost pixel electrode 14 and the light-shielding layer 14' in the peripheral region.

Figure 2:
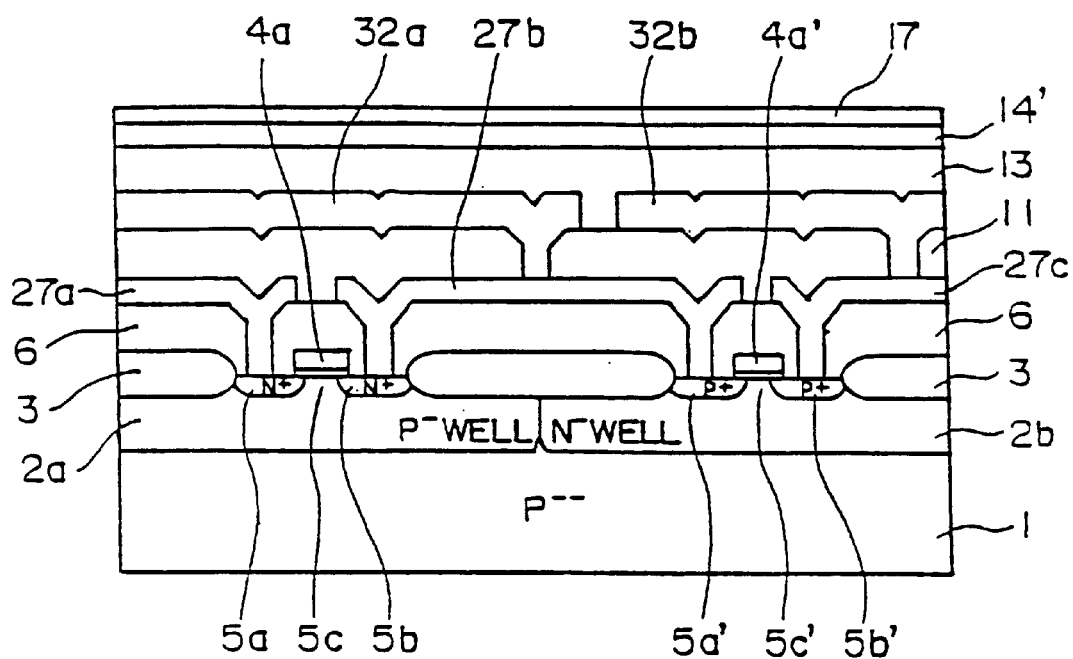
FIG. 2 is a cross-sectional diagram showing a peripheral region in a reflective-electrode-side substrate of a reflective-type liquid crystal panel incorporated in the present invention.

FIG. 2 is a cross-sectional diagram of an embodiment of a CMOS circuit element forming the peripheral circuits such as a driving circuit in the outside of the pixel region. In FIG. 2, the reference numerals identify a substantially identical metallic layer, insulating film, and semiconductor region formed by the identical steps as those of FIG. 1.

In FIG. 2, numerals 4a and 4a' indicate gate electrodes of an N-channel MOSFET and a P-channel MOSFET, respectively, forming the peripheral circuits (CMOS circuits), reference numerals 5a (5b) and 5a' (5b') indicate an N-type doping region and a P-type doping region, respectively, each used to be the source (drain) region of the above, and 5c and 5c' indicate channel regions. The contact region 80 supplying a constant voltage to the P-type doping region 8 forming one electrode of the holding capacitor of FIG. 1 is formed by the same step as that of the P-type doping region 5a' (5b') to be used as the source (drain) region of the P-channel MOSFET. Reference numerals 27a and 27c indicate source electrodes which are formed of a first metallic layer and connected to a power source voltage (0 V, 5 V, or 15 V), and reference numeral 27b indicates a drain electrode formed of the first metallic layer. Reference numeral 32a is a wiring layer formed of a second metallic layer and is used as a line which connects elements forming the peripheral circuits therebetween. Reference numeral 32b is a power source line layer formed of the second metallic layer and is also serves as a light-shielding layer. The light-shielding layer 32b may be connected to any constant voltage such as $V_c$, LC-COM, or power source voltage of 0 V, or it may be connected to inconstant voltage while being electrically separated from the power source line and the like. Reference numeral 14' is a third metallic layer, and in the peripheral circuit portion, the third metallic layer is used as a light-shielding layer to prevent light from being transmitted through a semiconductor region forming the peripheral circuits and from generating carriers which cause unstable voltage in the semiconductor region. In other words, also in the peripheral circuits, light is light-shielded by the second and third metallic layers.

As is mentioned above, the passivation film 17 in the peripheral circuit portion may be a silicon nitride film, which is superior as a protective film to the silicon oxide film forming the passivation film of the pixel region, or may be a protective film having a double-layer structure in which a silicon nitride film is formed on a silicon oxide film. Furthermore, although not particularly limited, the source/drain regions of the MOSFET forming the peripheral circuits of this embodiment may be formed by a self-aligning manner. Any of the source/drain regions of the MOSFET may have a LDD (lightly doped drain) structure or a DDD (double doped drain) structure. Off-set structure (in which the gate electrode and the source/drain regions are positioned with a distance therebetween) is preferably employed for the pixel switching FET considering the fact that the FET is driven by a large voltage and it must prevent the light leakage current.

Figure 4A:
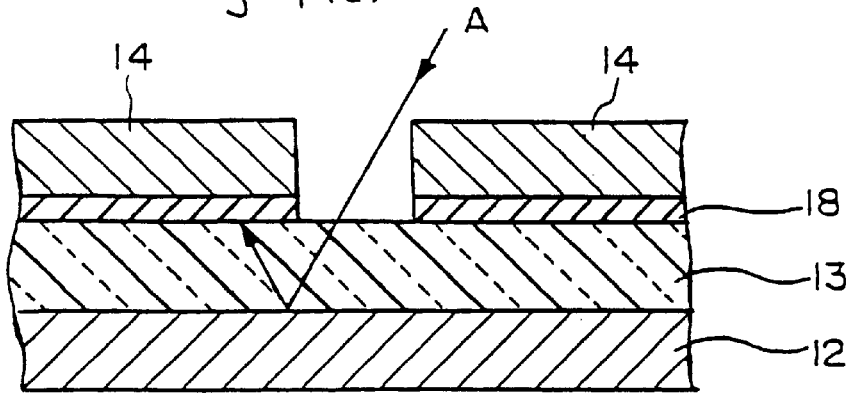
FIGS. 4(a), 4(b) and 4(c) are cross-sectional diagrams showing other embodiments of a structure of a space between pixel electrodes in a reflective-electrode-side substrate of a reflective-type liquid crystal panel incorporated in the present invention.
Figure 4B:
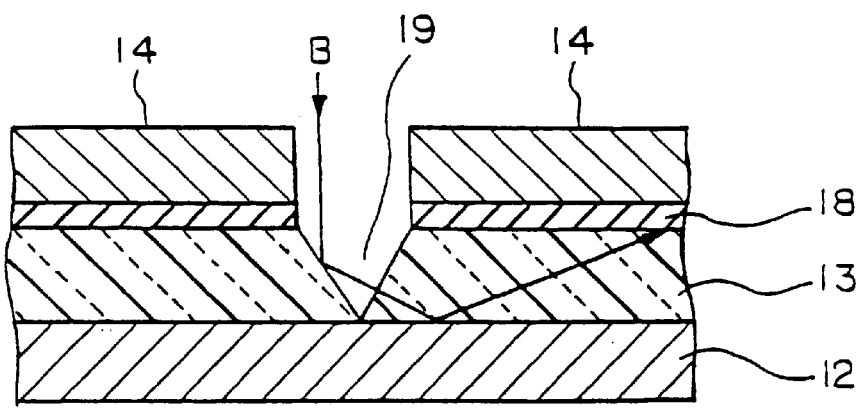
Figure 4C:
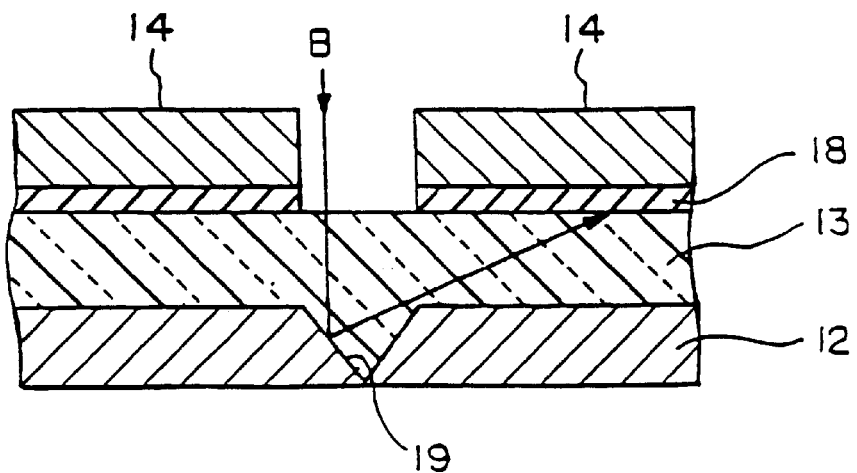

FIGS. 4(a), 4(b), and 4(c) each indicate another embodiment of a liquid crystal panel reflective-electrode-side substrate incorporated in the present invention. In FIGS. 4(a) to 4(c), the reference numerals identify substantially identical layers and semiconductor regions formed by the identical steps as those of FIGS. 1 and 2.

In the embodiment shown in FIG. 4(a), an anti-reflection film 18 formed of a material such as titanium nitride, i.e., TiN, is provided on the back surface of the pixel electrodes 14 of the embodiment shown in FIG. 1. Such an anti-reflection film 18 further increases the light-shielding effect as compared with that in the first embodiment of FIG. 1. In other words, since the light-shielding layer 12 provided in the first embodiment is formed of a metallic layer having a relatively high reflectance, such as aluminum, the light obliquely incident on a space between the pixel electrodes 14, as is shown by reference numeral A in FIG. 4(a), is reflected by the surface of the light-shielding layer 12, is further reflected by the back surface of a pixel electrode 14, and then, by repeating such reflection. The light may finally leak through the opening 12a, which is provided at the position of the connecting plug 15, to the MOSFET side, reach the substrate, and result in a light leakage current. However, when the anti-reflection film 18 is provided, it can absorb the light incident on the space between the pixel electrodes 14, and thus the light leakage current can further be effectively prevented. The preferred thickness of the anti-reflection film 18 formed of titanium nitride (TiN) is 500 to 1000 angstroms. The anti-reflection film 18 may not only be formed on the back surface of the pixel electrodes, but also on the surface of the light-shielding layer 12 or intermediately in the interlayer insulating layer.

The embodiment shown in FIG. 4(b) is constructed as follows: in the embodiment shown in FIG. 4(a) in which the anti-reflection film 18 is provided on the back surface of the pixel electrodes 14, a V-shape groove 19 at least having a slope is formed between the adjacent pixel electrodes on the surface of the third interlayer insulating film 13 exposed to the space between the pixel electrodes 14. The light vertically incident on the space between the pixel electrodes 14, as is shown by reference numeral B, is thereby reflected obliquely, and is absorbed into the antireflection film 18 formed on the back surface of the pixel electrodes. Thus, the light, reflected by the surface of the insulating film exposed to the space between the pixel electrodes or by the underlying light-shielding layer, can be prevented from emerging while changing the direction by 180°. When such reflected light emerges, the image quality may deteriorate in a liquid crystal panel of a normally white mode in which the liquid crystal panel is allowed to display white by reflecting incident light when no voltage is applied to the pixel electrodes, because the light emerging after being reflected by the space between the pixel electrodes is displayed similarly to the light reflected by a pixel electrode without an applied voltage. However, such reflected light can be eliminated by forming the V-shape groove 19 as is shown in FIG. 4(b), in the interlayer insulating film 13, thereby improving the image quality.

The embodiment shown in FIG. 4(c) is constructed as follows: in the embodiment shown in FIG. 4(a) in which the anti-reflection film 18 is provided on the back surface of the pixel electrodes 14, a V-shaped groove 19 is formed along the border between the pixel electrodes on the surface of the light-shielding layer 12 positioned below the space between the pixel electrodes 14. Similar effects to those of the embodiment of FIG. 4(b) are thereby obtained.

Although the groove 19 in FIGS. 4(b) and 4(c) has a V-shaped cross-section, the cross-sectional shape of the groove 19 is not limited to the V-shape, and as long as the inner face of the groove has a slope, the incident light is reflected by the slope and changes its direction shifted by 180° with respect to the incident direction so that the reflected light is absorbed into the anti-reflection film. The shape of the groove may be such that a slope is formed along the end portion of one pixel electrode and a vertical face is provided along the end portion of the adjacent pixel electrode, or may be formed into a substantial V-shape groove with a small flat portion at the bottom or into a plurality of rows of such grooves.

In the above structures shown in FIGS. 4(a), 4(b) and 4(c) in addition to the interlayer insulating film 13 formed of the above-mentioned TEOS film (including the SOG film left by partial etching), a silicon nitride film may be formed thereunder between the reflective electrodes 14 and the underlying metallic layer as the light-shielding layer 12. On the contrary, a silicon nitride film may be formed above the TEOS film 13. By employing such a double-layer structure, to which the silicon nitride film is added, for the interlayer insulating film 13, water or the like cannot readily enter the resulting film, thereby improving moisture resistance. The interlayer insulating film having such a double-layer structure may be formed not only on the pixel region, but also on the second metallic layers 32a and 32b in the peripheral region, and the moisture resistance is thereby improved in the peripheral region. In addition, since the refractive index of the silicon nitride film is between 1.9 to 2.2, which value is higher than that of the silicon oxide film, i.e., 1.4 to 1.6, used for the protective insulating film 17, the incident light is reflected by the interface between the protective insulating film 17 and the silicon nitride film, due to the difference in the refractive index when light is incident on the protective insulating film 17 from the liquid crystal side. The amount of the light incident on the interlayer film is thereby reduced. Thus, it is possible to prevent the phenomenon that carriers are generated by the light passing through the semiconductor region and destabilize the voltage in the semiconductor region.

FIG. 5 is a plan layout showing a whole liquid crystal panel substrate (reflective-electrode-side substrate) incorporated in the above embodiment.

In this embodiment, a light-shielding layer 25 is provided so as to prevent light from being incident on the peripheral circuits which are provided in the periphery of the substrate, as is shown in FIG. 5. The light-shielding layer is formed from the same layer as that of the pixel electrodes 14. The peripheral circuits are provided around the pixel region 20 in which the pixel electrodes are arranged according to a matrix pattern. The peripheral circuits include: a data line driving circuit 21 supplying image signals, corresponding to image data, to the data lines 7; a gate line driving circuit 22 scanning the gate lines 4 in order; an input circuit 23 receiving image data input from outside via a pad region 26; a timing control circuit 24 controlling such circuits; and the like. These circuits are formed of: MOSFETs, as active elements or switching elements, formed by the same or different step for forming the pixel electrode switching MOSFET; and load elements such as resistors or capacitors.

In this embodiment, the light-shielding layer 25 is formed of a third metallic layer formed by the same step as that of the pixel electrodes 14 shown in FIG. 1, and a predetermined voltage such as the power source voltage, the center voltage of the image signals, or the LC common voltage is applied to the light-shielding layer 25. By applying the predetermined voltage to the light-shielding layer 25, the reflection can be reduced as compared with applying a floating or other voltage. The light-shielding layer 25 can be allowed to float without connecting to a power source line. Displaying errors can thereby be avoided in the peripheral region, since the light-shielding layer 25 does not apply a voltage to the liquid crystal layer.

Reference numeral 26 indicates the pad region in which a pad or terminal used for supplying the power source voltage is formed. The sealing member 36 is arranged such that the pad region 26 to which signals are input from outside is positioned outside the sealing member 36.

FIG. 6 shows the cross-sectional structure of a reflective-type liquid crystal panel to which the liquid crystal panel substrate 31 is applied. As is shown in FIG. 6, a support substrate 32 made of glass, ceramic, etc. is adhered to the back surface of the liquid crystal panel substrate 31 using an adhesive. Furthermore, an incident-side glass substrate 35, which is provided with an opposing electrode (also called as common electrode) 33 made of a transparent conductive film (ITO), and to which the LC common voltage is applied, is positioned at the surface side of the liquid crystal panel substrate 31 with an appropriate distance therebetween, and a known TN (Twisted Nematic) type liquid crystal or a SH (Super Homeotropic) type liquid crystal 37, in which liquid crystal molecules are aligned substantially homeotropically without an applied voltage, is poured into the resulting space sealed by the sealing member 36 to complete the liquid crystal panel 30.

The light-shielding layer 25 on the peripheral circuits is arranged to face the opposing electrode 33 with the liquid crystal 37 interposed therebetween. Since the LC common voltage is applied to the opposing electrode 33, by applying the LC common voltage to the light-shielding layer 25, no dc voltage is applied to the liquid crystal interposed therebetween. Therefore, the liquid crystal molecules are always twisted by approximately 90° in the case of the TN-type liquid crystal, and are always aligned homeotropically in the case of the SH-type liquid crystal.

In this embodiment, the strength of the liquid crystal panel substrate 31 formed of a semiconductor substrate is significantly increased because the liquid crystal panel substrate 31 has the support substrate 32 made of glass, ceramic, etc. adhered to the back surface thereof using the adhesive. As a result, by joining the opposing substrate to the liquid crystal panel substrate 31 after adhering the support substrate 32 to the liquid crystal panel substrate 31, a uniform gap is advantageously obtained in the liquid crystal layer of the entire panel.

Explanation of Liquid Crystal Panel Substrate Using Insulating Substrate

Although the structure of a liquid crystal panel substrate using a semiconductor substrate and a liquid crystal panel employing the liquid crystal panel substrate is explained above, the structure of a reflective-type liquid crystal panel substrate using an insulating substrate such as glass will be described below.

FIG. 10 shows a cross-sectional view of the structure of a pixel in a reflective-type liquid crystal panel substrate. Similarly to FIG. 1, this figure shows a cross-sectional view taken along line I—I of the plan layout shown in FIG. 3. In this embodiment, a TFT is employed as a transistor for switching the pixel. In FIG. 10, the reference numerals identify layers and semiconductor regions having substantially identical functions as those of FIGS. 1 and 2. Reference numeral 1 indicates a silica or non-alkaline glass substrate having a single-crystal, polycrystalline, or amorphous silicon film (the layer forming 5a, 5b, 5c, and 8) formed thereon, and insulating films 4b and 9b, having a double-layer structure formed of a silicon oxide film formed by heat oxidation and another silicon oxide film or silicon nitride film deposited by CVD, are formed on the silicon film. Before forming the upper silicon oxide film or silicon nitride film of the insulating film 4b, N-type impurities are doped into the regions 5a, 5b, and 8 of the silicon film to form the source region 5a and drain region 5b of a TFT, and the electrode region 8 of the holding capacitor. Furthermore, a wiring layer which is made of poly-silicon, metallic silicide, etc., and which is to be used as the gate electrode 4a of the TFT and the other electrode 9a of the holding capacitor, is formed on the insulating film 4b. As is mentioned above, the TFT formed of the gate electrode 4a, the gate insulating film 4b, the channel 5c, the source 5a, and the drain 5b, and the holding capacitor formed of the electrodes 8 and 9a and the insulating film 9b are formed.

In addition, the first interlayer insulating film 6 made of silicon nitride or silicon oxide is formed on the wiring layers 4a and 9a, and the source electrode 7a connected to the source region 5a via a contact hole made in the insulating film 6, is formed by a first metallic layer formed of an aluminum layer. The interlayer insulating film 11 and the light-shielding layer 12 are formed on the first metallic layer similarly to those shown in FIG. 1. The second interlayer insulating film 13 formed of silicon oxide, silicon nitride, or a double-layer of silicon oxide and silicon nitride is formed on the light-shielding layer 12. The second interlayer insulating film 13 is planarized by the CMP method, and pixel electrodes, to be used as reflective electrodes, are formed from aluminum for each pixel on the planarized second interlayer insulating film 13. The electrode region 8 of the silicon film and the pixel electrode 14 are electrically connected via the contact hole 16. Similarly to that shown in FIG. 1, this connection is achieved by embedding the connecting plug 15 made of a refractory metal such as tungsten. The light-shielding layer 12 is formed on the portion corresponding to the cross-sectional diagram of FIG. 1(b), and a light-shielding layer 12', which light-shields the light incident on a space between the pixel electrode 14 and the light-shielding layer 14' light-shielding the peripheral region of the pixel electrode 14, is formed as a second metallic layer below the pixel electrode 14 and the light-shielding layer 14'.

As is mentioned above, since the reflective electrode is positioned above the TFT and holding capacitor formed on the insulating substrate, the pixel electrode region increases, and the holding capacitor also can be formed in a larger area under the reflective electrode similarly to the plan layout of FIG. 3. Thus, even in a high resolution (small pixel) panel, the drive is stabilized because the voltage applied to each pixel can be maintained, and in addition, a high aperture ratio (reflectance) can be achieved.

As is similar to the above embodiments, the passivation film 17 formed of a silicon oxide film is formed on the reflective electrode 14. The structure of the liquid crystal panel substrate as a whole and that of the liquid crystal panel are similar to those shown in FIGS. 5 and 6. Therefore, the peripheral circuits such as the driving circuit employ the TFT as a transistor element. In the peripheral region including the peripheral circuit portion, the second metallic layers 32a and 32b are formed above the CMOS type TFT as connecting lines between the elements and as a light-shielding layer elongated or separated therefrom, as is similar to FIG. 2.

If light also enters from below the substrate, another light-shielding layer may be provided under the silicon films 5a, 5b, and 8. Although the top-gate type in which the gate electrode is positioned above the channel is shown in the figure, it is also good to provide the bottom-gate type in which the gate electrode is formed beforehand, and a silicon film to be used as the channel on a gate insulating film interposed therebetween may be employed. Furthermore, moisture resistance of the peripheral circuit region can be improved by employing the silicon nitride film or the double-layer structure film formed of a silicon oxide film and a silicon nitride film.

Explanation of Electronic Equipment Using the Reflective-type Liquid Crystal Panel of the Present Invention FIG. 8 shows electronic equipment using a liquid crystal panel of the present invention, and is a plan diagram illustrating the main portion of a projector (projection type display device) using reflective-type liquid crystal panels of the present invention as light valves. FIG. 8 shows a polarizing illuminator 100 having a light source portion 110 positioned on the center line of an optical element 130, an integrator lens 120, and the polarization conversion element 130; a polarization beam splitter 200 reflecting the S-polarized light beam, emerging from the polarizing illuminator 100, by a S-polarized light reflection surface 201; a dichroic mirror 412 separating a blue light (B) component from the light reflected by the S-polarized light reflection surface 201 of the polarization beam splitter 200; a reflective-type liquid crystal light valve 300B modulating the separated blue light (B); a dichroic mirror 413 reflecting the light, from which the blue light has been separated, and separating a red light (R) component therefrom; a reflective-type liquid crystal light valve 300R modulating the separated red light (R); a reflective-type liquid crystal light valve 300G modulating the residual green light (G) transmitted through the dichroic mirror 413; and a projection optical system 500 formed of projection lenses by which light, that is modulated by the three reflective-type liquid crystal light valves 300R, 300G, and 300B and then synthesized by the dichroic mirrors 412 and 413 and the polarization beam splitter 200, is projected on a screen 600. Each of the three reflective-type liquid crystal light valves 300R, 300G, and 300B is provided with the liquid crystal panel.

The randomly polarized light beam emerging from the light source portion 110 is separated into a plurality of intermediate light beams by the integrator lens 120, converted into one type of polarized light beams (S-polarized light beams) polarized in substantially the same direction by the polarization conversion element 130 having a second integrator lens on the light-incident side, and reaches the polarization beam splitter 200. The S-polarized light beams emerging from the polarization conversion element 130 are reflected by the S-polarized light reflection surface 201 of the polarization beam splitter 200, and among the reflected light beams, the blue light (B) beams are reflected by the blue light reflection layer of the dichroic mirror 412 and are modulated by the reflective-type liquid crystal light valve 300B. Among the light beams transmitted through the blue light reflection layer of the dichroic mirror 412, the red light (R) beams are reflected by the red light reflection layer of the dichroic mirror 413 and are modulated by the reflective-type liquid crystal light valve 300R.

Meanwhile, the green light (G) beams transmitted through the red light reflection layer of the dichroic mirror 413 are modulated by the reflective-type liquid crystal light valve 300G. The reflective-type liquid crystal panel in which modulation is carried out by the reflective-type liquid crystal light valves 300R, 300G, and 300B according to the above-mentioned manner employs the TN-type liquid crystal (in which the major axis of liquid crystal molecules is aligned substantially parallel to the panel substrate under no applied voltage) or the SH-type liquid crystal (in which the major axis of liquid crystal molecules is aligned substantially perpendicular to the panel substrate under no applied voltage).

When employing the TN-type liquid crystal, in a pixel (OFF pixel) in which a voltage below the threshold voltage of the liquid crystal is applied to the liquid crystal layer interposed between the reflective electrode of the pixel and the common electrode of the opposing substrate, the incident color light is elliptically polarized by the liquid crystal layer, is reflected by the reflective electrode, and emerges via the liquid crystal layer as the nearly elliptically polarized light beams whose polarization axis component is almost entirely shifted by substantially 90° from the polarization axis of the incident color light. Meanwhile, in a pixel (ON pixel) in which a voltage is applied to the liquid crystal layer, the incident color light reaches the reflective electrode unchanged, is reflected, and emerges while maintaining the same polarization axis as that of the incident light. Since the alignment angle of the liquid crystal molecules of the TN-type liquid crystal changes according to the voltage applied to the reflective electrode, the angle of the polarization axis of the reflected light with respect to the incident light varies with the voltage applied to the reflective electrode via the transistor of the pixel.

In addition, when employing the SH-type liquid crystal, in a pixel (OFF pixel) in which the voltage applied to the liquid crystal layer is below the threshold voltage of the liquid crystal, the incident color light reaches the reflective electrode unchanged, is reflected, and emerges while maintaining the same polarization axis as that of the incident light. Meanwhile, in a pixel (ON pixel) in which a voltage is applied to the liquid crystal layer, the incident color light is elliptically polarized by the liquid crystal layer, is reflected by the reflective electrode, and emerges via the liquid crystal layer as the nearly elliptically polarized light beams whose polarization axis component is almost entirely shifted by substantially 90° from the polarization axis of the incident light. Similarly to the TN-type liquid crystal, the alignment angle of the liquid crystal molecules of the SH-type liquid crystal changes according to the voltage applied to the reflective electrode, and the angle of the polarization axis of the reflected light with respect to the incident light varies with the voltage applied to the reflective electrode via the transistor of the pixel.

Among the color light reflected by the pixels of the liquid crystal panel, the polarization beam splitter 200, which reflects S-polarized light, passes the P-polarized component, but does not pass the S-polarized component. The light transmitted through the polarization beam splitter 200 forms an image. Therefore, when the TN-type liquid crystal is employed for the liquid crystal panel, the projected image is in the normally white mode, since the reflected light of the OFF pixel reaches the projection optical system 500 and that of the ON pixel does not reach the lens. When the SH-type liquid crystal is employed, the projected image is in the normally black mode, since the reflected light of the OFF pixel does not reach the projection optical system and that of the ON pixel reaches the projection optical system 500.

According to the reflective-type liquid crystal panel, by utilizing a semiconductor technique, a larger number of pixels can be formed and the panel size can be reduced as compared with active-matrix liquid crystal panel having a TFT array formed on a glass substrate. Thus, images with higher resolution can be projected by smaller-sized projectors.

As is described with reference to FIG. 6, the peripheral circuit portion of the liquid crystal panel is covered with a light-shielding layer and the same voltage (e.g., LC common voltage, however, if the LC common voltage is not applied, a voltage different from the opposing electrode of the pixel portion is applied, thus a peripheral opposing electrode is separated from the opposing electrode of the pixel portion) as that applied to the opposing electrode formed on the opposing substrate is applied to the peripheral circuit portion. Thus, substantially 0 V is applied to the liquid crystal interposed therebetween and the liquid crystal is in the OFF state. Therefore, in accordance with the normally white mode, the entire periphery of the image region can display white mode in a TN-type liquid crystal panel, and the entire periphery of the image region can display black mode in a SH-type liquid crystal panel in accordance with the normally black mode.

According to the above embodiment, the voltage applied to each of the reflective-type liquid crystal panels 300R, 300G, and 300B is sufficiently maintained and also the reflectance of each pixel electrode is extremely high. Thus, sharp images can be obtained.

FIGS. 9(*a*), 9(*b*) and 9(*c*) shows an outside view of electronic equipment employing a reflective-type liquid crystal panel of the present invention. The reflective-type liquid crystal panels employed in these electronic equipment fundamentally have the same structure as those used as the light valves, except that the reflective electrodes are not required to have a completely reflective face, and far from it, the reflective electrodes preferably have an appropriately roughened surface to increase the angle of view because the reflective-type liquid crystal panels are used as direct viewing reflective-type liquid crystal panels in these electronic equipment and are not used as light valves combined with a polarization beam splitter.

Figure 9A:
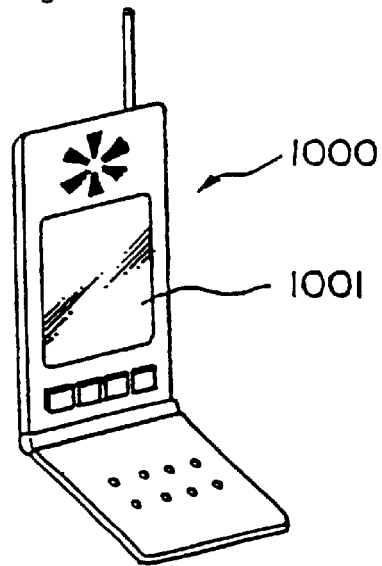
FIGS. 9(a), 9(b) and 9(c) each show electronic equipment using the reflective-type liquid crystal panel of the present invention.

FIG. 9(a) is a perspective view showing a cellular telephone. Reference numeral 1000 indicates the main body of the cellular telephone and reference numeral 1001 indicates a liquid crystal display portion using a reflective-type liquid crystal panel of the present invention.

Figure 9B:
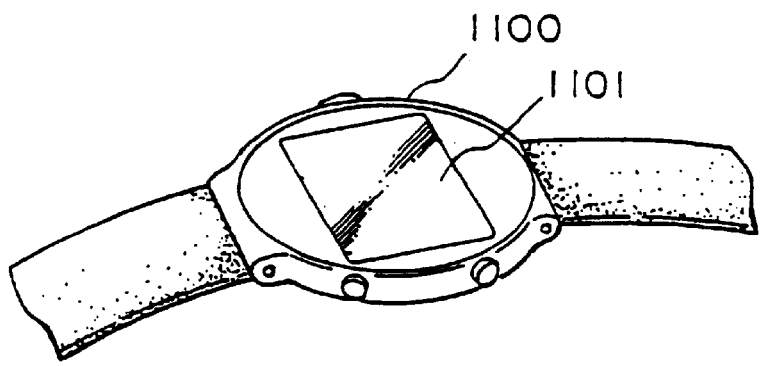

FIG. 9(b) shows wrist-watch-type electronic equipment. Reference numeral 1100 indicates the main body of the watch. Reference numeral 1101 indicates a liquid crystal display portion using a reflective-type liquid crystal panel of the present invention. Since the liquid crystal panel has pixels of higher resolution as compared with conventional watch display portion, it can display TV images, achieving wristwatch-type TVs.

Figure 9C:
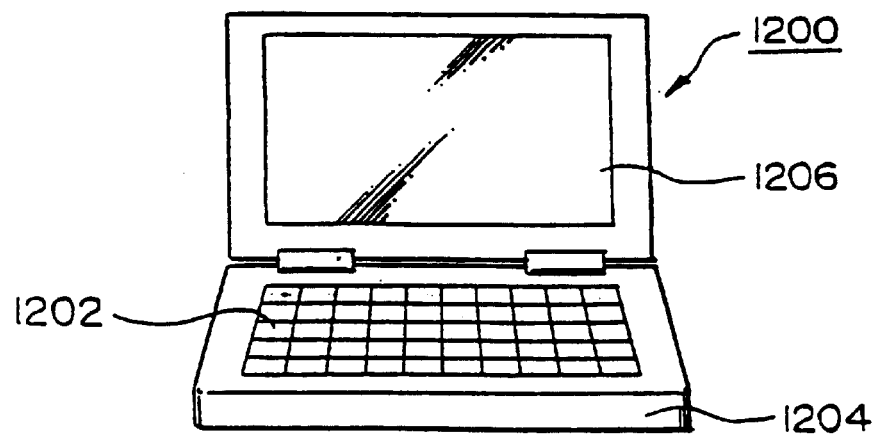

FIG. 9(c) shows a mobile data-processing device of a word processor or a personal computer. Reference numeral 1200 indicates the data-processing device, reference numeral 1202 indicates an input unit such as a keyboard or the like, reference numeral 1206 indicates a display portion using a reflective-type liquid crystal panel of the present invention, and reference numeral 1204 indicates the main body of the data-processing device. Since each of the electronic equipment is driven by batteries, the life-time of the batteries can be extended by using a reflective-type liquid crystal panel that does not have a light source lamp. In addition, as is mentioned in the present invention, the peripheral circuits can be built in the panel substrate; the number of components is largely reduced, and more light-weight and smaller-sized equipment can be achieved.

In the above embodiments, the TN-type liquid crystal, and the SH-type liquid crystal which is homeotropically aligned, are employed as the liquid crystal for liquid crystal panels. However, the present invention can be realized by using other types of liquid crystals.

As is mentioned above, according to the present invention, a light-shielding layer is made between a pixel electrode, which is used as a reflective electrode, and a conductive layer, which constitutes a terminal electrode of a switching element applying a voltage to the pixel electrode, such that in the pixel region, the light-shielding layer has only an opening for forming a contact hole connecting the pixel electrode and the terminal electrode. Thus, the amount of light leaking from the incident side to the driving-element side can be reduced to substantially zero and the amount of a light leakage current flowing in a semiconductor layer or semiconductor substrate can be largely decreased.

In addition, in a reflective-type liquid crystal panel having a pixel region, in which the pixel electrodes are arranged in a matrix pattern, and peripheral circuits provided around the pixel region on the same substrate, a light-shielding layer formed of the same layer as a metallic layer forming the reflective electrodes in the pixel region is provided for the peripheral circuits. Thus, without increasing the number of process steps, the amount of light leakage in the pixel region and the peripheral circuits can be reduced, thereby decreasing the light leakage current.

Moreover, in a reflective-type liquid crystal panel having a pixel region, in which the pixel electrodes are arranged in a matrix pattern, and peripheral circuits provided around the pixel region on the same substrate, a light-shielding layer of the pixel region is formed below the pixel electrode layer from a layer used as a wiring layer or a light-shielding layer of the peripheral circuits. Thus, the light-shielding layer can be formed without increasing the number of process steps.

Furthermore, since an anti-reflection film is formed at the bottom side of the pixel electrode, the light reflected by the surface of the light-shielding layer can be absorbed, even if the light-shielding layer is formed of a metallic layer having a relatively high reflectance. Thus, the following phenomenon can be prevented: the light repeatedly reflected between the surface of the light-shielding layer and the back surface of the pixel electrode leaks through an opening provided at the portion of a conductor which connects a pixel electrode and a switching electrode, reaches the semiconductor layer or the semiconductor substrate, and generates a light leakage current.

In addition, an anti-reflection film is formed at the bottom side of the pixel electrode and a groove at least having a slope is formed between pixel electrodes on the surface of an insulating film exposed to a space between the pixel electrodes in the pixel region or on the surface of a light-shielding layer below the insulating film. Thus, the light incident on the space between the pixel electrodes is reflected in an oblique direction and is absorbed into the anti-reflection film on the back surface of the pixel electrodes so that the light reflected by the surface of the insulating film, exposed to the space between the pixel electrodes, or the light-shielding layer below the insulating film, is prevented from emerging while changing its direction by 180°. Therefore, the image quality can be improved.

What is claimed is:

1. A substrate having a pixel electrode, comprising:
   a substrate;
   a plurality of pixel units, each pixel unit including a pixel electrode useable as a reflective electrode and a switching element electrically connected to said pixel electrode, said pixel units being arranged in a matrix pattern on the substrate, the plurality of pixel units forming a pixel region;
   a peripheral circuit positioned at a peripheral region of said pixel region, the peripheral region including no pixel units, the peripheral circuit and the pixel region being formed on the same substrate;
   a first light-shielding layer formed above the peripheral circuit to cover the peripheral circuit and formed from the same layer as the reflective electrode;
   a second light-shielding layer provided between the pixel electrode and the switching element; and
   a connecting line provided in the peripheral region and formed from the same layer as the second light-shielding layer.

2. The substrate having a pixel electrode as set forth in claim 1, wherein in said pixel region, the second light-shielding layer is provided between said pixel electrode and said switching element, and said second light-shielding layer is provided in a region between said first light-shielding layer formed above said peripheral circuit, and said pixel electrodes that are outermost in said pixel region.

3. The substrate having a pixel electrode as set forth in claim 1, wherein between said pixel electrode and a conductive layer composing a terminal electrode of said switching element, a contact hole is provided for connecting said pixel electrode and said terminal electrode;
   the second light-shielding layer, having an opening surrounding a portion in which said contact hole is formed in said pixel region and having no opening in regions between a plurality of adjacent pixel electrodes, is formed between said pixel electrode and said conductive layer; and in said peripheral circuit, said second light-shielding layer is also provided below said first light-shielding layer and is used as a connecting line portion in said peripheral circuit.

4. The substrate having a pixel electrode as set forth in claim 3, wherein said second light-shielding layer has a light-shielding portion extended or separated from said connecting line portion.

5. A liquid crystal panel comprising: a substrate having a pixel electrode as set forth in claim 1; a light-incident-side substrate positioned opposing said substrate with a space therebetween; and a liquid crystal encapsulated in said space.

6. Electronic equipment comprising the liquid crystal panel as set forth in claim 5 as a display portion.

7. A projection type display device comprising:

a light source;

the liquid crystal panel as set forth in claim 5 for reflecting and modulating light emerging from said light source; and projection optical means for collecting and projecting light modulated by said liquid crystal panel.

8. The substrate having a pixel electrode as set forth in claim 1, comprising another substrate opposing to the substrate, the substrate and the another substrate being joined by a sealing member, wherein the light-shielding layer is not formed at the portion corresponding to a sealing member.

9. The substrate having a pixel electrode as set forth in claim 8, wherein the sealing member is arranged so as to surround the light-shielding layer disposed at the peripheral portion.

10. A substrate having a pixel electrode, comprising:

a substrate;

a plurality of pixel units, each pixel unit including a pixel electrode useable as a reflective electrode and a switching element electrically connected to said pixel electrode, said pixel units being arranged in a matrix pattern on the substrate, the plurality of pixel units forming a pixel region;

a peripheral circuit positioned at a peripheral region of said pixel region, the peripheral region including no pixel units, the peripheral circuit and the pixel region being formed on the same substrate;

a light-shielding layer provided between the pixel electrode and the switching element and also provided above the peripheral circuit; and a connecting line provided in the peripheral region and formed from the same layer as the light-shielding layer.

11. A substrate having a pixel electrode, comprising:

a substrate;

a plurality of pixel units arranged in a matrix form on the substrate, the plurality of pixel units forming a pixel region, each pixel unit including a pixel electrode useable as a reflective electrode and a switching element electrically connected to said pixel electrode;

a peripheral circuit positioned at a peripheral region of said pixel region, the peripheral region including no pixel units, the peripheral circuit and the pixel region being formed on the same substrate, the peripheral circuit comprising a P-channel transistor and a N-channel transistor;

a first light-shielding layer formed above the peripheral circuit to cover the peripheral circuit and formed from the same layer as the reflective electrode;

a second light-shielding layer provided between the pixel electrode and the switching element; and a connecting line provided in peripheral region and formed from the same layer as the second light-shielding layer, the connecting line connecting to the P-channel transistor and the N-channel transistor.

12. The substrate having a pixel electrode as set forth in claim 11, wherein in said pixel region, the second light-shielding layer is provided between said pixel electrode and said switching element, and said second light-shielding layer is provided in a region between said first light-shielding layer formed above said peripheral circuit, and said pixel electrodes that are outermost in said pixel region.

13. The substrate having a pixel electrode as set forth in claim 11, wherein between said pixel electrode and a conductive layer composing a terminal electrode of said switching element, a contact hole is provided for connecting said pixel electrode and said terminal electrode;

the second light-shielding layer, having an opening surrounding a portion in which said contact hole is formed in said pixel region and having no opening in regions between a plurality of adjacent pixel electrodes, is formed between said pixel electrode and said conductive layer; and in said peripheral circuit, said second light-shielding layer is also provided below said first light-shielding layer and is used as a connecting line portion in said peripheral circuit.

14. The substrate having a pixel electrode as set forth in claim 13, wherein said second light-shielding layer has a light-shielding portion extended or separated from said connecting line portion.

15. A liquid crystal panel comprising: a substrate having a pixel electrode as set forth in claim 11; a light-incident-side substrate positioned opposing said substrate with a space therebetween; and a liquid crystal encapsulated in said space.

16. Electronic equipment comprising the liquid crystal panel as set forth in claim 15, as a display portion.

17. A projection type display device comprising:

a light source;

the liquid crystal panel as set forth in claim 15 for reflecting and modulating light emerging from said light source; and projection optical means for collecting and projecting light modulated by said liquid crystal panel.

18. The substrate having a pixel electrode as set forth in claim 11, comprising another substrate opposing to the substrate, the substrate and the another substrate being joined by a sealing member, wherein the light-shielding layer is not formed at the portion corresponding to a sealing member.

19. The substrate having a pixel electrode as set forth in claim 18, wherein the sealing member is arranged so as to surround the light-shielding layer disposed at the peripheral portion.

20. A substrate having a pixel electrode, comprising:

a substrate;

a plurality of pixel units arranged in a matrix form on the substrate, the plurality of pixel units forming a pixel region, each pixel unit including a pixel electrode useable as a reflective electrode and a switching element electrically connected to said pixel electrode;

a peripheral circuit positioned at a peripheral region of said pixel region, the peripheral region including no pixel units, the peripheral circuit and the pixel region being formed on the same substrate, the peripheral circuit comprising a P-channel transistor and a N-channel transistor;

a light-shielding layer provided between the pixel electrode and the switching element and also provided above the peripheral circuit;

a connecting line provided in the peripheral region and formed of the same layer as the light-shielding layer, the connecting line connecting to the P-channel transistor and the N-channel transistor.

21. The substrate having a pixel electrode as set forth in claim 20, wherein in said pixel region, the second light-shielding layer is provided between said pixel electrode and said switching element, and said second light-shielding layer is provided in a region between said first light-shielding layer formed above said peripheral circuit, and said pixel electrodes that are outermost in said pixel region.

22. The substrate having a pixel electrode as set forth in claim 20, wherein between said pixel electrode and a conductive layer composing a terminal electrode of said switching element, a contact hole is provided for connecting said pixel electrode and said terminal electrode;

the second light-shielding layer, having an opening surrounding a portion in which said contact hole is formed in said pixel region and having no opening in regions between a plurality of adjacent pixel electrodes, is formed between said pixel electrode and said conductive layer; and in said peripheral circuit, said second light-shielding layer is also provided below said first light-shielding layer and is used as a connecting line portion in said peripheral circuit.

23. The substrate having a pixel electrode as set forth in claim 22, wherein said second light-shielding layer has a light-shielding portion extended or separated from said connecting line portion.

24. A liquid crystal panel comprising: a substrate having a pixel electrode as set forth in claim 20; a light-incident-side substrate positioned opposing said substrate with a space therebetween; and a liquid crystal encapsulated in said space.

25. Electronic equipment comprising the liquid crystal panel as set forth in claim 24 as a display portion.

26. A projection type display device comprising:

a light source;

the liquid crystal panel as set forth in claim 24 for reflecting and modulating light emerging from said light source; and projection optical means for collecting and projecting light modulated by said liquid crystal panel.

27. The substrate having a pixel electrode as set forth in claim 20, comprising another substrate opposing to the substrate, the substrate and the another substrate being joined by a sealing member, wherein the light-shielding layer is not formed at the portion corresponding to a sealing member.

28. The substrate having a pixel electrode as set forth in claim 27, wherein the sealing member is arranged so as to surround the light-shielding layer disposed at the peripheral portion.

* * * * *